(12) United States Patent
Dolci et al.

(10) Patent No.: US 9,215,833 B2
(45) Date of Patent: Dec. 15, 2015

(54) ELECTRONIC DEVICE WITH HEAT DISSIPATING ELECTROMAGNETIC INTERFERENCE SHIELDING STRUCTURES

(71) Applicant: Apple Inc., Cupertino, CA (US)

(72) Inventors: Dominic E. Dolci, Berkeley, CA (US); Phillip S. Satterfield, Oakland, CA (US); Vikas K. Sinha, Redwood City, CA (US)

(73) Assignee: Apple Inc., Cupertino, CA (US)

( * ) Notice: Subject to any disclaimer, the term of this patent is extended or adjusted under 35 U.S.C. 154(b) by 300 days.

(21) Appl. No.: 13/839,903

(22) Filed: Mar. 15, 2013

(65) Prior Publication Data

US 2014/0268578 A1    Sep. 18, 2014

(51) Int. Cl.
*H05K 7/20* (2006.01)
*H05K 9/00* (2006.01)
*H05K 1/02* (2006.01)

(52) U.S. Cl.
CPC .............. *H05K 9/0049* (2013.01); *H05K 1/021* (2013.01); *H05K 7/20436* (2013.01); *H05K 9/0022* (2013.01); *H05K 7/205* (2013.01); *H05K 7/20409* (2013.01); *H05K 7/20418* (2013.01); *H05K 7/20854* (2013.01)

(58) Field of Classification Search
CPC ..... H05K 9/0049; H05K 1/021; H05K 7/205; H05K 7/20409; H05K 7/20854; H05K 7/209; H05K 7/2089; H05K 7/20418
See application file for complete search history.

(56) References Cited

U.S. PATENT DOCUMENTS

| 5,581,443 | A |   | 12/1996 | Nakamura et al. |
| 5,973,923 | A | * | 10/1999 | Jitaru, Ionel ................. 361/704 |
| 6,049,469 | A |   | 4/2000 | Hood, III et al. |
| 6,501,662 | B2 | * | 12/2002 | Ikeda, Hideo ................ 361/760 |
| 6,570,086 | B1 | * | 5/2003 | Shimoji et al. ................ 174/377 |
| 6,646,865 | B2 |   | 11/2003 | Huang et al. |
| 6,717,799 | B2 | * | 4/2004 | Hamano et al. .......... 361/679.54 |
| 6,781,851 | B2 |   | 8/2004 | Daoud et al. |
| 6,831,844 | B1 |   | 12/2004 | Lee et al. |

(Continued)

FOREIGN PATENT DOCUMENTS

| CN | 102656961 A | 9/2012 |
| DE | 102009054517 | 6/2011 |
| TW | 201250566 A | 12/2012 |

OTHER PUBLICATIONS

Dolci et al., U.S. Appl. No. 13/623,436, filed Sep. 20, 2012.

*Primary Examiner* — Gregory Thompson
(74) *Attorney, Agent, or Firm* — Treyz Law Group; G. Victor Treyz

(57) ABSTRACT

An electronic device may have a metal electromagnetic interference shielding enclosure. The enclosure may have a bottom wall, vertical sidewalls that extend upwards from the bottom wall, and a lid that covers the enclosure to define an interior cavity. Power supply components and other electrical components may be mounted within the interior cavity. A printed circuit board on which integrated circuits and other components are mounted may have an upper surface that faces the bottom wall of the enclosure and an opposing lower surface that faces a metal plate. Fence structures may be used to help shield components mounted on the printed circuit. Heat may be dissipated from components on the printed circuit into the bottom wall and into the metal plate. A plastic housing may be used to house the shielding enclosure, printed circuit board, components mounted on the printed circuit board, and the metal plate.

23 Claims, 11 Drawing Sheets

(56) References Cited

U.S. PATENT DOCUMENTS

| | | | |
|---|---|---|---|
| 7,312,998 B2* | 12/2007 | Kamemoto et al. | 361/719 |
| 7,345,883 B2* | 3/2008 | Wakabayashi et al. | 361/714 |
| 7,417,198 B2 | 8/2008 | Betz et al. | |
| 8,929,078 B2* | 1/2015 | Weeber et al. | 361/714 |
| 9,048,124 B2* | 6/2015 | Dolci et al. | 1/1 |
| 2003/0039098 A1* | 2/2003 | Takami, Satoshi | 361/719 |
| 2006/0126309 A1* | 6/2006 | Bolle et al. | 361/719 |
| 2008/0062668 A1* | 3/2008 | Kakinoki et al. | 361/816 |
| 2010/0246143 A1 | 9/2010 | Dinh et al. | |
| 2012/0069522 A1 | 3/2012 | Hung | |
| 2012/0300405 A1* | 11/2012 | Weeber et al. | 361/709 |
| 2012/0306824 A1 | 12/2012 | Horie | |

\* cited by examiner

ELECTRONIC DEVICE WITH HEAT DISSIPATING ELECTROMAGNETIC INTERFERENCE SHIELDING STRUCTURES

BACKGROUND

This relates generally to electronic devices and, more particularly, to radio-frequency shielding and thermal management structures for components in electronic devices.

Electronic devices often contain components such as radio-frequency transmitters and other circuits that use electromagnetic interference (EMI) shielding structures. Electromagnetic interference shielding structures may help prevent radio-frequency signals that are generated by one component from disrupting the operation of another component that is sensitive to radio-frequency interference. Electromagnetic shielding structures may be formed from metal shielding cans soldered to printed circuit boards. A typical shielding has an inner metal fence and an outer metal lid structure.

The operation of integrated circuits such as radio-frequency transmitters and other circuitry tends to generate heat. To properly dissipate heat that is generated during operation, heat sink structures may be thermally coupled to the exterior of an electromagnetic shielding can. To ensure satisfactory heat transfer from a shielded integrated circuit to a heat sink, a thermally conductive elastomeric pad may be interposed between the integrated circuit and the shielding can to fill air gaps between the integrated circuit and the shielding can and another thermally conductive elastomeric pad may be interposed between the shielding can and the heat sink. The use of multiple thermally conductive paths and separate heat sink and electromagnetic interference shielding structures tends to make designs of this type complex and costly and may reduce the efficacy of the overall structure in removing heat from a component during operation.

It would therefore be desirable to be able to provide improved ways in which to provide components in electronic devices with heat sinking and electromagnetic interference shielding structures.

SUMMARY

An electronic device may have a metal electromagnetic interference shielding enclosure. The enclosure may have a bottom wall, vertical sidewalls that extend upwards from the bottom wall, and a lid that covers the enclosure to define an interior cavity. Power supply components and other electrical components may be mounted within the interior cavity. For example, electrical components may be mounted to a dielectric substrate and installed within the interior cavity. The electromagnetic interference shielding enclosure may help prevent interference that is generated by the electrical components from interfering with the operation of external circuitry and may help prevent interference from external circuitry from reaching the internal electrical components.

A printed circuit board on which integrated circuits and other components are mounted may have an upper surface that faces the bottom wall of the enclosure and an opposing lower surface that faces a metal plate. Fence structures may be used to shield components mounted on the printed circuit. The fence structures may provide lateral shielding. Shielding below the components on the upper surface of the printed circuit may be provided using metal traces in the printed circuit. Shielding above the components on the upper surface of the printed circuit may be provided using the bottom wall of the shielding enclosure.

Heat may be dissipated from components on the printed circuit into the bottom wall of the enclosure and into the metal plate. The metal plate may have protrusions that form a recess into which connectors on the edge of the printed circuit are received. The metal plate may have different areas with different thicknesses to accommodate components on lower surface of the printed circuit board of different heights.

A plastic housing may be used to house the shielding enclosure, printed circuit board, components mounted on the printed circuit board, and the metal plate.

Further features, their nature and various advantages will be more apparent from the accompanying drawings and the following detailed description of the preferred embodiments.

DETAILED DESCRIPTION

An electronic device may be provided with electronic components such as integrated circuits. These components may be provided with electromagnetic interference shielding and heat sinking structures. Electromagnetic interference shielding functions may be provided by mounting electrical components within the interior of a metal enclosure that serves to reduce electromagnetic signal interference while dissipating heat generated by components. Electromagnetic interference shielding structures with integrated thermal management features may therefore sometimes be referred to as electromagnetic interference shielding enclosures or structures or may sometimes be referred to as heat-sinking electromagnetic interference shielding enclosures. Additional heat sinking and shielding may be provided using additional metal structures such as a metal plate that is mounted beneath a metal enclosure.

Figure 1:
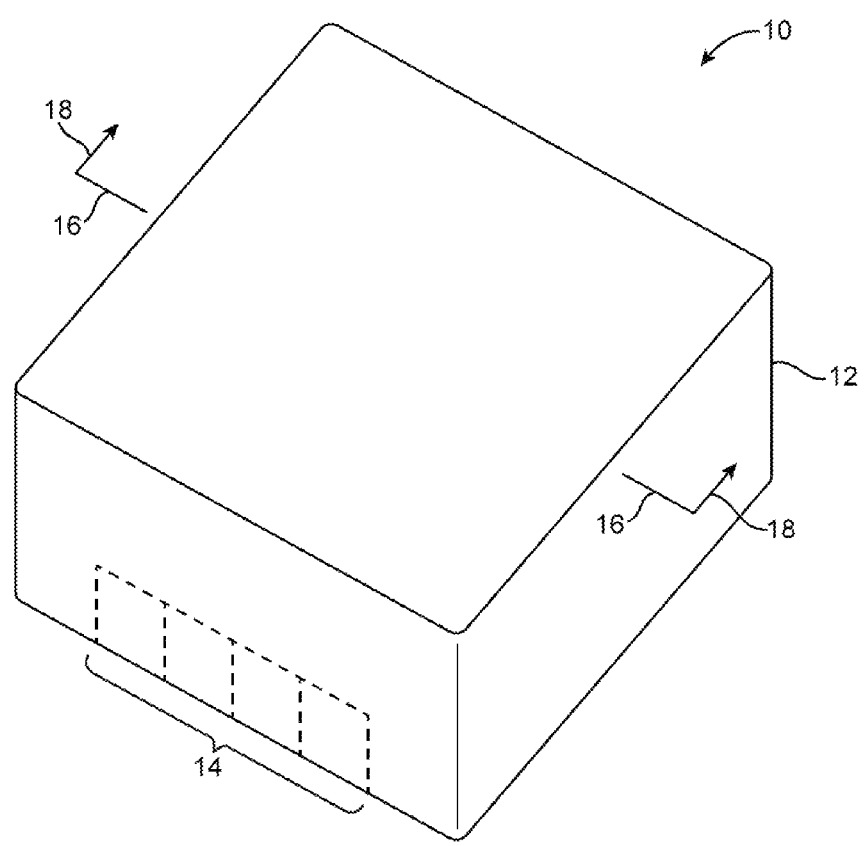
FIG. 1 is a perspective view of an illustrative electronic device of the type that may be provided with electromagnetic interference shielding and thermal management structures in accordance with an embodiment.

An illustrative electronic device of the type that may be provided with an electromagnetic interference shielding enclosure that serves as a heat sink for electrical components is shown in FIG. 1. Electronic device 10 of FIG. 1 has openings 14 in housing 12. Openings 14 form connector ports for connectors such as Ethernet plugs, Universal Serial Bus connectors, power connectors, audio jacks, connectors for coaxial cables for television signals and other signals, and other connectors. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or can be formed using multiple structures (e.g., an internal frame structure, one or more structures that form exterior housing surfaces, etc.).

Electronic device 10 of FIG. 1 may be a set-top box, a wireless access point, a router, a storage device, a device for providing still and moving images to an attached display such as a television or computer monitor, a cellular telephone, a handheld portable device such as a media player, a somewhat smaller portable device such as a wrist-watch device, a pendant device, other wearable or miniature device, gaming equipment, tablet computer, notebook computer, desktop computers, television, computer monitor, a computer integrated into a computer display, a hybrid device that includes the functionality of two or more devices such as these, or other electronic equipment. The use of a set-top box form factor in implementing device 10 is merely illustrative.

Device 10 may include internal structures such as printed circuits. Electrical components may be mounted on the printed circuits and may be electrically connected through conductive paths in the printed circuits and in external cables. Printed circuits in device 10 may include rigid printed circuit boards (e.g., printed circuits formed from fiberglass-filled epoxy or other rigid substrate material) and/or flexible printed circuits (e.g., printed circuit substrates formed from flexible polymer layers such as sheets of polyimide). Components that may be mounted on the printed circuits include power supply components, inductors, capacitors, resistors, integrated circuits, switches, connectors, sensors, wireless circuits, and other components. Some of these components and the printed circuits on which the components are mounted may be mounted within the interior of a shielding enclosure. For example, power supply components may be mounted within an interior cavity of a main shielding structure that has the shape of a hollow metal box. Other components may be mounted to the exterior of the shielding enclosure. Additional shielding structures and heat sinking structures such as metal plate structures may be used in covering the components that are mounted to the exterior of the shielding structure.

When mounted using arrangements such as these, the shielding enclosure structures may prevent signal interference from disrupting the operation of the shielded components and may prevent the interference signals from the shielded structures from escaping the shielding structures. Heat sinking may also be provided by the shielding structures to ensure that the components do not overheat. Shielding structures that are configured to perform heat sinking may be formed using electrically and thermally conductive materials such as aluminum, stainless steel, or other metals. If desired, other electrically and thermally conductive materials may be used such as plastics covered and/or filled with metal particles so that the plastics are thermally and electrically conductive, etc.

Figure 2:
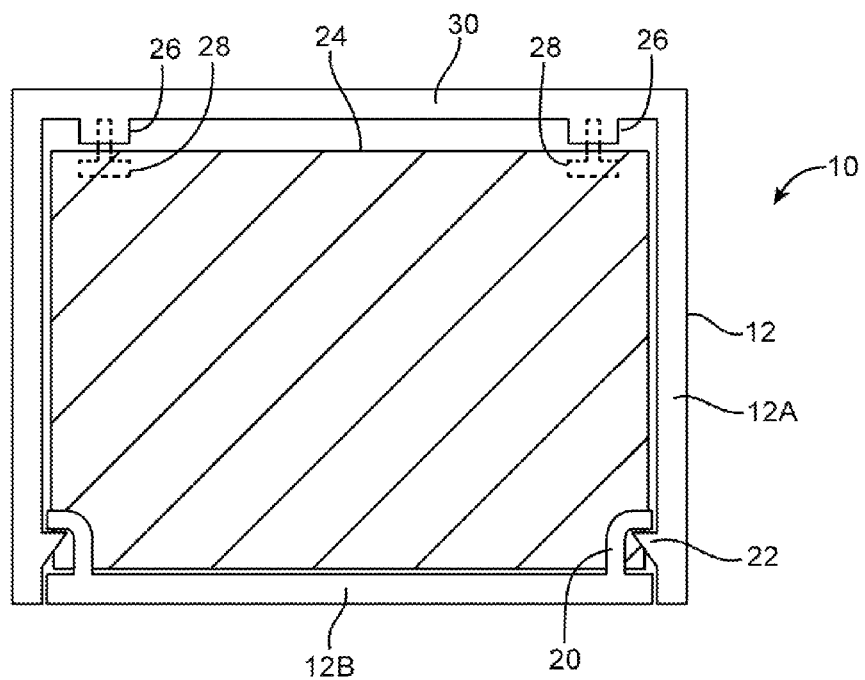
FIG. 2 is a cross-sectional side view of an illustrative electronic device with electromagnetic interference shielding and thermal management structures in accordance with an embodiment.

A cross-sectional side view of device 10 of FIG. 1 taken along line 16 and viewed in direction 18 is shown in FIG. 2. As shown in FIG. 2, device 10 may include interior structures 24 (e.g., electrical components mounted in electromagnetic interference shielding and thermal management structures) and an exterior housing 12 that surrounds interior structures 24. Exterior housing 12 may be formed from a cosmetically appealing material such as white or black plastic (as examples). Housing 12 may be formed from multiple housing structures such as base housing structure 12B and top (upper) housing structure 12A. Housing structure 12B may have the shape of a planar rectangular rear housing member that lies in a horizontal plane (in the orientation of FIG. 2). Housing structure 12A may have the shape of an open box with a downwards facing opening.

Housing structure 12B and housing structure 12A may have interlocking structures such as engagement features 20 on housing structure 12B and engagement features 22 on housing structure 12A. To assemble device 10, internal structures 24 may be mounted within housing structure 12A. Screws 28 may be screwed into openings in housing bosses 26 on housing structure 12A to secure internal structures 24 to housing structure 12A. After internal structures 24 have been mounted in housing structure 12A, rear housing structure 12B may be pressed into place against the bottom of housing 12, thereby causing engagement features 20 to engage with engagement features 22 and thereby couple rear housing member 12B to housing member 12A.

Figure 3:
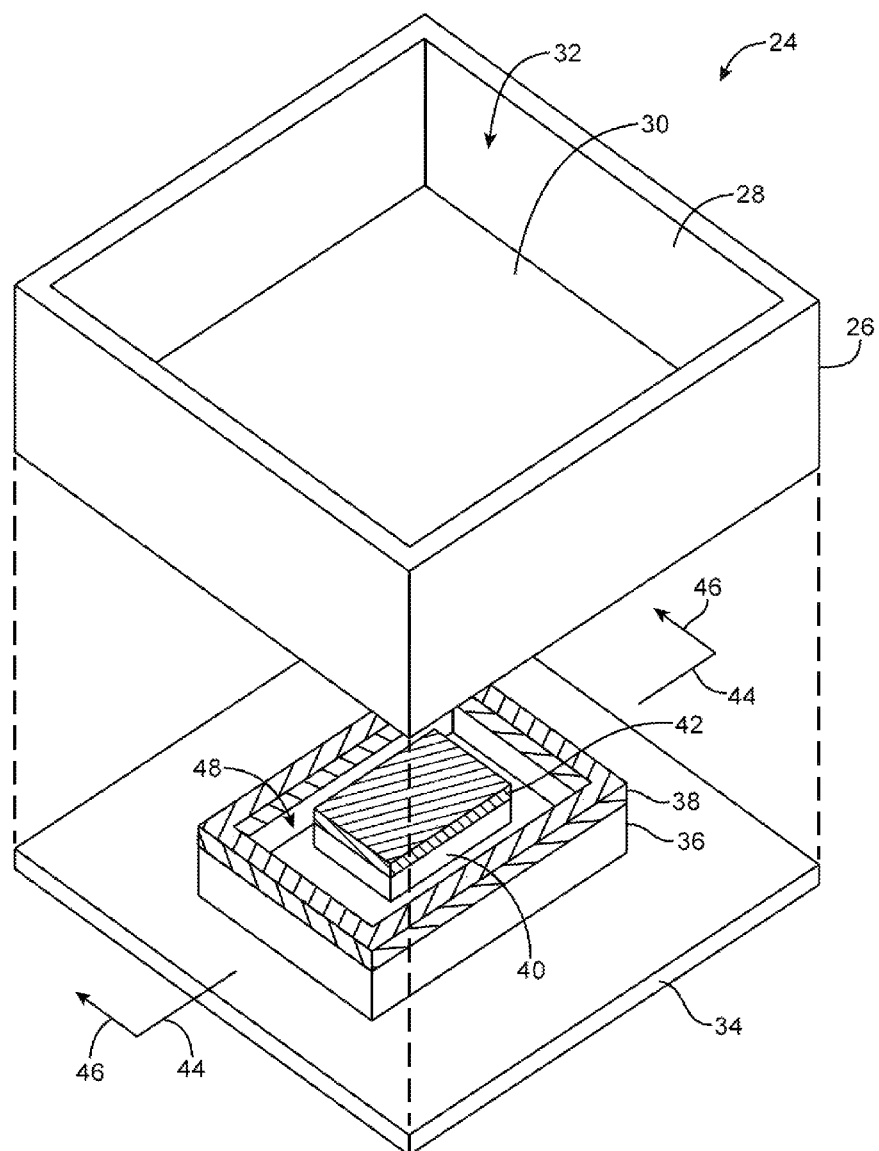
FIG. 3 is an exploded perspective view of an illustrative electronic device with electromagnetic interference shielding and thermal management structures in accordance with an embodiment.

An exploded perspective view of interior structures 24 is shown in FIG. 3. As shown in FIG. 3, interior structures 24 may include open-topped box-shaped shielding enclosure 26. Shielding enclosure 26 may have sidewalls such as four vertical sidewalls 28 that extend upwardly as integral portions of horizontal rectangular bottom wall 30. Power supply components and other electrical components may be mounted within interior 32 of shielding enclosure 26. A lid (cover) may be mounted on top of shielding enclosure 26 to enclose the components that have been mounted within shielding enclosure 26. The lid and shielding enclosure 26 may be formed from an electrically and thermally conductive material such as metal.

Interior structures 24 (sometimes referred to as internal structures 24) may include one or more substrates such as one or more printed circuits 34. Electrical components such as illustrative electrical component 40 may be mounted on one or both sides of each printed circuit 34. Components such as component 40 may be integrated circuits, discrete components, or other electrical devices. In the FIG. 3 example, there is a single component 40 mounted to the upper surface of printed circuit 34. This is merely illustrative. In general, any suitable number of electrical components may be mounted on one or more printed circuit substrates such as substrate 34 if desired.

To provide electromagnetic signal interference shielding, component 40 may be surrounded by conductive shielding structures such as metal shielding structures 36. Metal shielding structure 36, which may sometimes be referred to as shielding fence structures or a shielding fence, may have the shape of a rectangular ring with a rectangular central opening such as opening 48 that receives one or more components such as component 40. Conductive gasket 38 (e.g., a conductive rectangular ring formed from a material such as conductive elastomeric plastic, conductive fabric, conductive foam, conductive foam covered with conductive fabric, or other conductive gasket material) may be interposed between shielding fence 36 and the lower surface of rear wall 30 of enclosure 26. Printed circuit 34 may include metal ground plane structures that run under structure 36 and components in opening 48 such as component 40, thereby providing shielding below component 40. Fence 36 may provide lateral shielding for component 40. The lower surface of bottom wall 30 of enclosure 26 may provide shielding above component 40. To ensure satisfactory electrical connect between gasket 38 and the lower surface of rear wall 30, it may be desirable to remove insulating materials from the surface of conductive layer 30 (e.g., by etching away an oxide layer or removing an oxide layer by laser exposure, etc.).

Components such as component 40 may generate heat during operation. To help dissipate the heat that is generated, enclosure 26 may serve as a heat sink. Satisfactory thermal conduction between component 40 and the underside of wall 30 of enclosure 26 may be achieved by interposing a thermally conductive elastomeric material such as elastomeric gap filler pad 42 between the upper surface of component 40 and the corresponding lower surface of rear wall 30.

With this type of arrangement, enclosure 26 may serve as a heat sink that helps to dissipate heat from component 40. For example, heat from component 40 may travel up sides 28 to be dissipated by thermal conduction to the surrounding environment and through radiation. At the same time, enclosure 26, in conjunction with peripheral shielding structures such as conductive fence 36, lower shielding structures such as printed circuit 34, and upper shielding structures such as bottom enclosure wall 30, may be used to provide electromagnetic signal interference shielding for components on printed circuit board 34 such as component 40. The enclosure formed by bottom wall 30, sidewalls 28, and a mating enclosure lid (not shown in FIG. 3) may serve as shielding for components mounted within interior cavity 32 of enclosure 26. Enclosure 26 may also help dissipate heat that is generated by the components mounted within interior 32 of enclosure 26.

Figure 4:
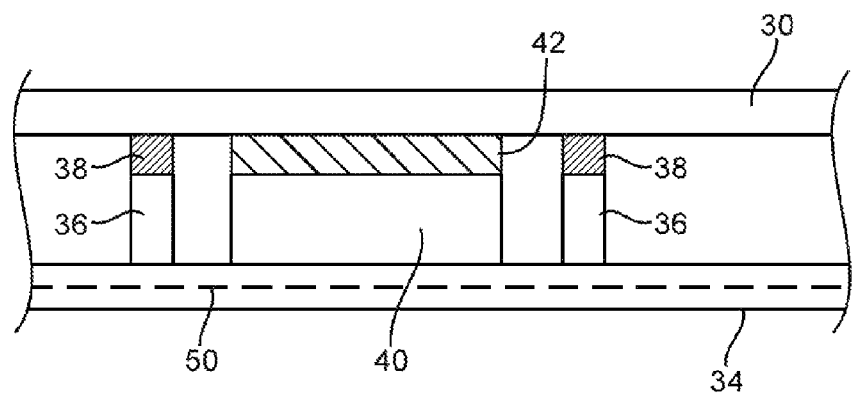
FIG. 4 is a cross-sectional side view of a portion of an electronic device having electromagnetic interference shielding and thermal management structures in accordance with an embodiment.

FIG. 4 is a cross-sectional side view of a portion of interior structures 24 of FIG. 3 in an assembled state. As shown in FIG. 4, component 40 may be sandwiched between bottom wall 30 of enclosure 26 and printed circuit 34. Heat may be dissipated from component 40 via thermally conductive elastomeric pad 42 (e.g., plastic filled with metal particles) and bottom wall 30 and other metal in enclosure 26. Electromagnetic signal interference shielding may be provided by embedded ground plane traces such as metal traces 50 in printed circuit 34, the sidewall shielding formed by fence structures 36 and gasket 38, and the upper shielding formed by wall 30.

Figure 5:
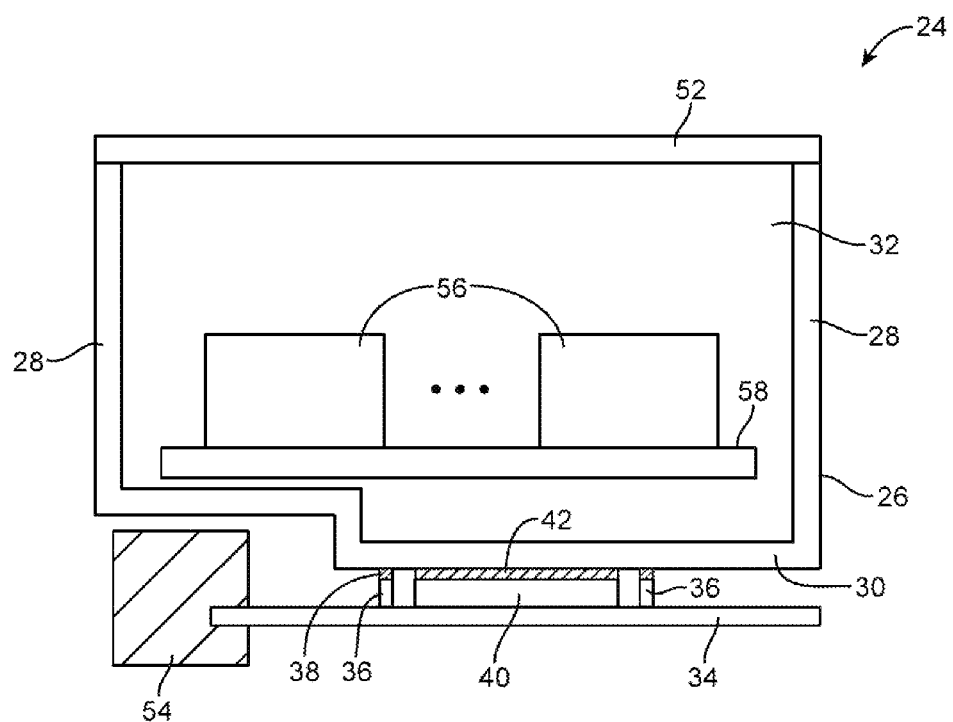
FIG. 5 is a cross-sectional side view of an illustrative electronic device having a hollow metal enclosure that serves as an electromagnetic interference shielding and thermal management structure in accordance with an embodiment.

FIG. 5 shows how an enclosure lid such as lid 52 may be used to seal the top opening of enclosure 26 and thereby form a completed shielding enclosure that surrounds components 56. Components 56 in the interior cavity of enclosure 26 may be mounted on one or more substrates such as dielectric substrate 58 (e.g., a flexible printed circuit, a rigid printed circuit board, etc.). Components 58 may be power supply components for forming a power supply in device 10 such as transformer coils, capacitors, diodes, integrated circuits, inductors, and resistors or other electrical components. The shielding provided by enclosure 26 (including lid 52) may help prevent external interference signals from disrupting the operation of components 56 and may help prevent interference signals that are generated by components 56 from interfering with external components outside of enclosure cavity 32. Connectors such as connector 54 may be mounted on printed circuit 34. Connectors such as connector 54 may include digital data connectors such as Ethernet connectors, High-Definition Multimedia Interface (HDMI) connectors, and Universal Serial Bus connectors, power connectors, audio jacks, connectors for coaxial cables for video such as television signals and other signals, and other connectors.

Signals may be routed between components 56 and components on board 34 such as component 40 and connector 54 using wires, flexible printed circuit cables, other cables, conductive housing structures, or other conductive paths. As an example, metal rods (sometimes referred to as power studs) may be used to convey power between board 58 and board 34, thereby allowing power supply circuitry formed from components 56 to be used in powering components on board 34 such as component 40.

Figure 6:
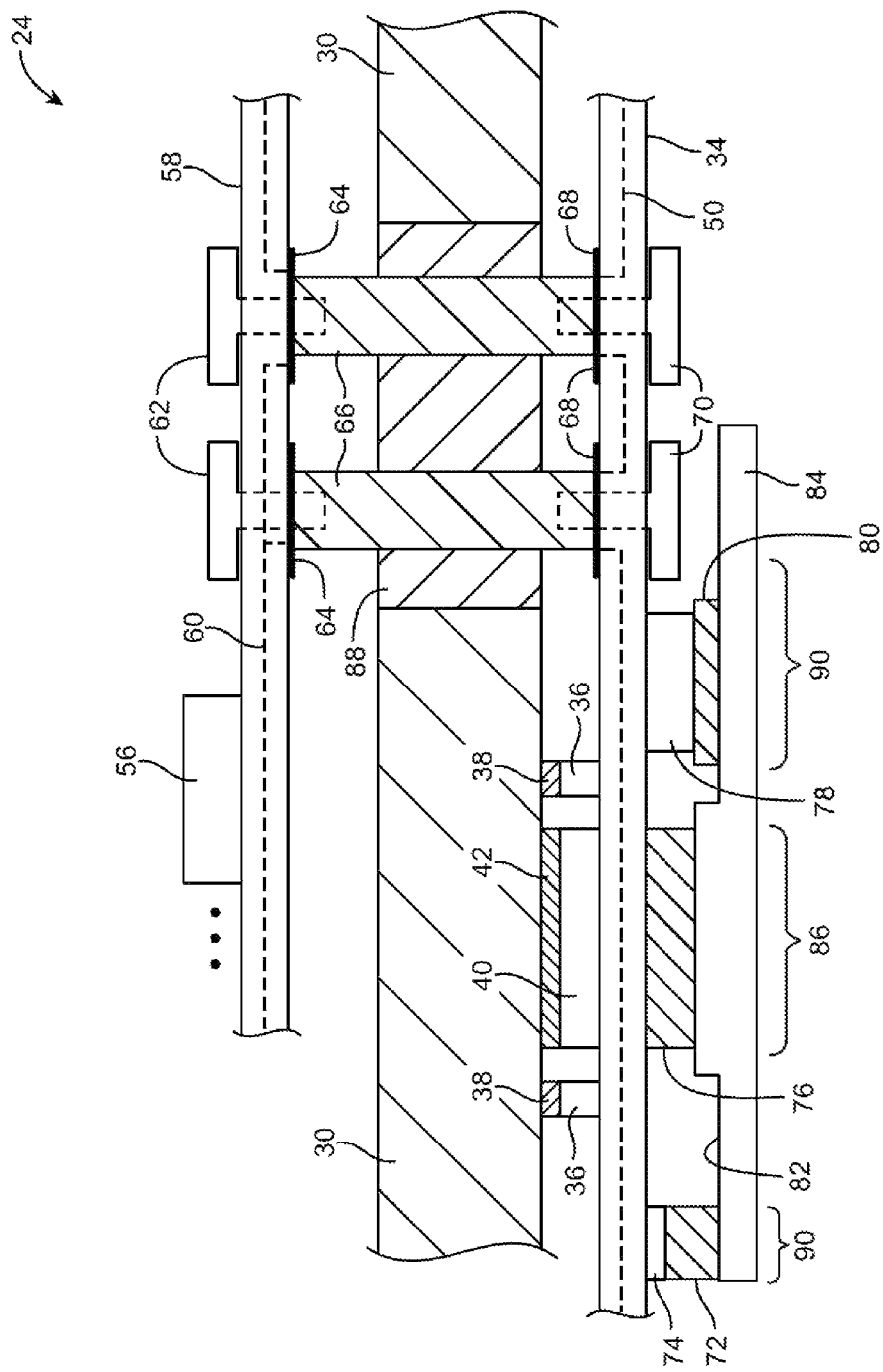
FIG. 6 is a cross-sectional side view of a portion of an electronic device showing electromagnetic interference shielding and thermal management structures that include a shielding enclosure and a metal plate in accordance with an embodiment.

As cross-sectional side view of a configuration for device 10 in which interior structures 24 include metal rods is shown in FIG. 6. As shown in FIG. 6, components 56 may be mounted on printed circuit board 58. Printed circuit board 58 may contain traces 60. Traces 60 may be coupled to contact pads such as contact pads 64. Metal rods 66 may respectively be used to form a positive power supply path and a ground power supply path through dielectric insert 88. Screws 62 may be used to hold rods 66 against the lower surface of printed circuit 58. Screws 70 may be used to hold rods 66 against the upper surface of printed circuit 34.

Dielectric insert 88 may be a plastic member that is press fit into an opening in lower wall 30 of enclosure 26. Dielectric insert 88 may insulate rods 66 from metal wall 30 and from each other.

Metal rods 66 may be coupled to contacts 68 on the surface of printed circuit 34. Contacts 68 may be coupled to traces 50 in printed circuit 34. Traces 50 may be used to distribute power from rods 66 to components such as component 40 on the upper surface of printed circuit 34 and, if desired, to components such as components 74 and 78 that are mounted on the opposing lower surface of printed circuit 34.

The lower surface of printed circuit 34 may face metal plate 84. Metal plate 84 may be used as a heat sink to help dissipate heat from electrical components mounted to board 34. Metal plate 84 may, for example, dissipate heat from components that are mounted to the upper surface of printed circuit 34 such as component 40. To help dissipate heat from component 40, thermally conductive elastomeric pad 76 may be interposed between the lower surface of printed circuit 34 and upper surface 82 of metal plate 84. Components such as components 74 and 78 that are mounted on the lower surface of printed circuit 34 can dissipate heat into metal plate 84 through respective thermally conductive elastomeric pads 72 and 80.

The thickness of metal plate 84 can be different in different areas of metal plate 84. For example, in region 86 in which plate 84 overlaps pad 76, the thickness of plate 84 can be relatively large to minimize the thickness of elastomeric pad 76 and thereby enhance thermal conductivity for heat passing through pad 76 into plate 84. In portions 90 of plate 84, plate 84 may be thinner and may have different thicknesses to accommodate the different heights of components 74 and 80 on the lower surface of printed circuit 34. If desired, fence structures and conductive gaskets such as fence 36 and gasket 38 may surround components such as components 74 and 78 on the underside of printed circuit 34 and may extend between printed circuit board 34 and plate 84 to provide shielding for components such as components 74 and 78 on the underside of printed circuit 34. Components on the upper and lower surfaces of printed circuit 34 may also be shielded using shielding cans.

Figure 7:
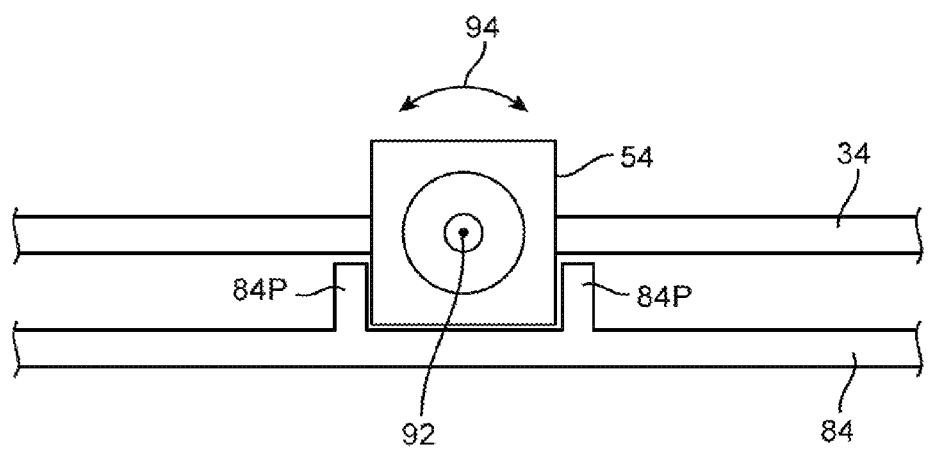
FIG. 7 is a cross-sectional side view of a portion of an electronic device in which connector mounting structures in a metal plate structure have been used to prevent undesired rotation of a connector on a printed circuit relative to the device in accordance with an embodiment.

FIG. 7 is an end view of metal plate 84 showing how metal plate 84 may have vertically extending protrusions 84P that form a recess that receives and supports connector 54. As a user attaches a cable to connector 54 or detaches a cable from connector 54, connector 54 may be twisted about rotational axis 92 in directions 94. The support provided by protruding support structures such as integral protrusions 84P on metal plate 84 may help connector 54 to resist twisting motion and thereby remain mounted satisfactorily to printed circuit 34.

It may be desirable to attach metal plate 84 or other metal shielding and heat dissipating structures to internal structures 24 (e.g., bottom enclosure wall 30) using fasteners such as screws. To ensure that thermally conductive elastomeric pads in structures 24 are properly compressed against components mounted on the upper and lower surfaces of printed circuit 34, screws or other fasteners for attaching plate 84 may be concentrated near to components on printed circuit 34 and the associated elastomeric pads on these components. As shown in the bottom view of internal structures 24 in FIG. 8, for example, screw holes and screws 96 may be concentrated around locations such as locations 98 that overlap electrical components on printed circuit 34 and associated elastomeric pads.

Figure 8:
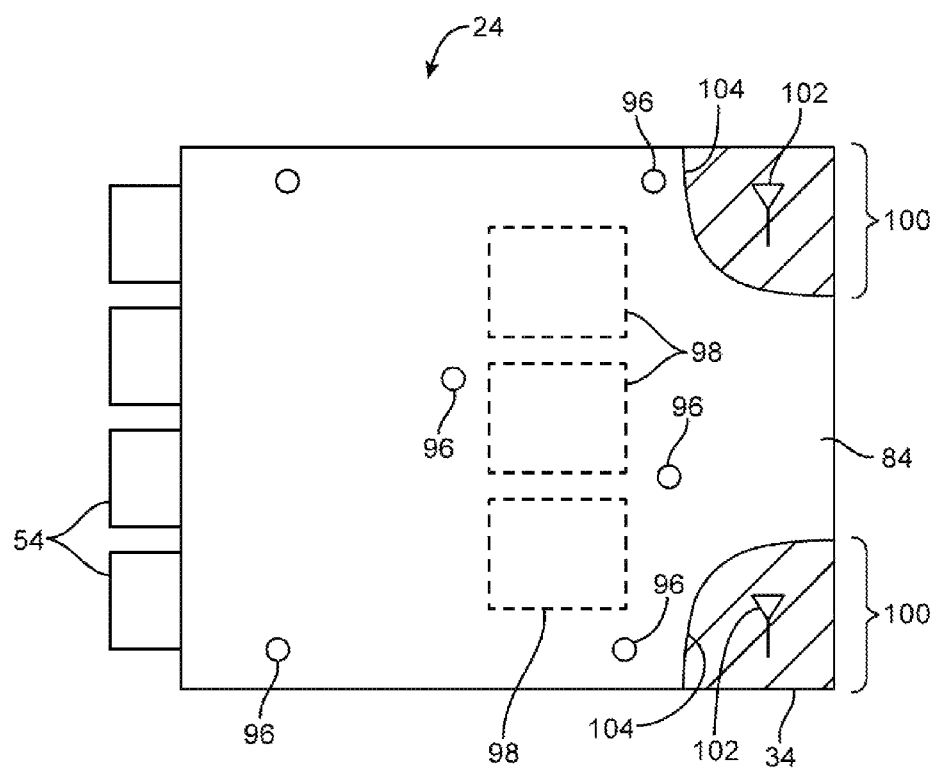
FIG. 8 is a bottom view of an interior portion of an electronic device showing where screw holes may be located relative to components mounted in the device in accordance with an embodiment.

Plate 84 may, if desired, have corner recesses 100 (see, e.g., curved edges 104 in the corners of plate 84, which form quarter-circle recesses 100 at the upper right and lower right corners of plate 84 in the orientation of FIG. 8). Recesses 100 at the corners of plate 84 may be used to accommodate wireless communications structures such as antennas 102. Antennas 102 may be inverted-F antennas or antennas of other types. Antennas 102 may include antenna resonating elements (e.g., inverted-F antenna resonating elements) formed from metal traces on the corners of printed circuit 34. Metal plate 84 and other metal structures in internal structures 24 may be used in forming an antenna ground. Plate 84 and corner portions of enclosure 26 may be set back from the antenna resonating elements on printed circuit 34 to ensure that antennas 102 exhibit satisfactory bandwidth and antenna efficiency. The inverted-F antennas formed from the inverted-F antenna resonating elements and the antenna ground may be fed using coaxial cables, microstrip transmission lines, or other transmission line structures.

Figure 9:
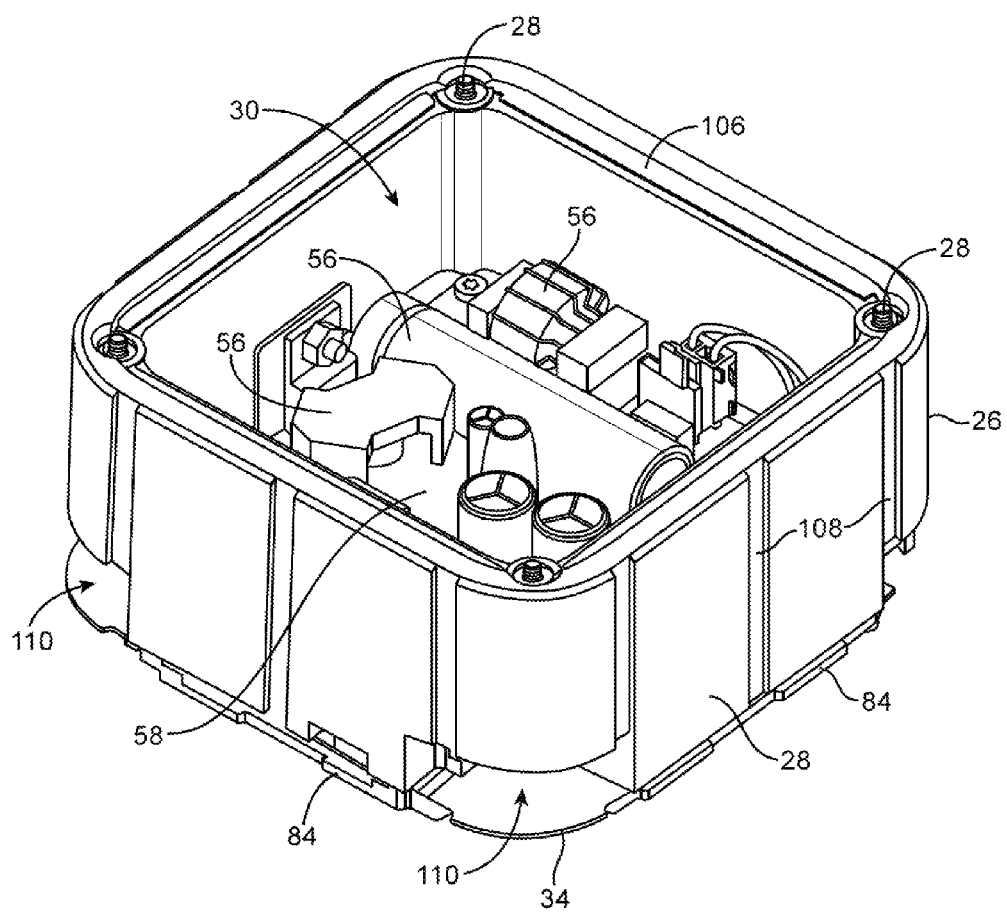
FIG. 9 is a perspective view of an interior portion of an electronic device having a electromagnetic interference shielding and thermal management structure without a lid in accordance with an embodiment.

FIG. 9 is a perspective view of illustrative interior structures 24. In the example of FIG. 9, enclosure 26 has a rectangular box shape with an upper rectangular opening that is configured to receive a lid. The lid has been removed in FIG. 9, exposing conductive gasket 106, which runs around the periphery of the rectangular opening for enclosure 26. Gasket 106 may be formed from conductive foam covered with conductive fabric or other conductive gasket material. Grooves 108 in walls 28 of enclosure 26 may accommodate engagement features on housing 12A such as protrusions 22 (FIG. 2) when interior structures 24 slide into the interior of member 12A during assembly. Enclosure 26 may have corners recesses such as recesses 110 to accommodate antennas 102 on the corners of printed circuit 34, as described in connection with FIG. 8.

Figure 10:
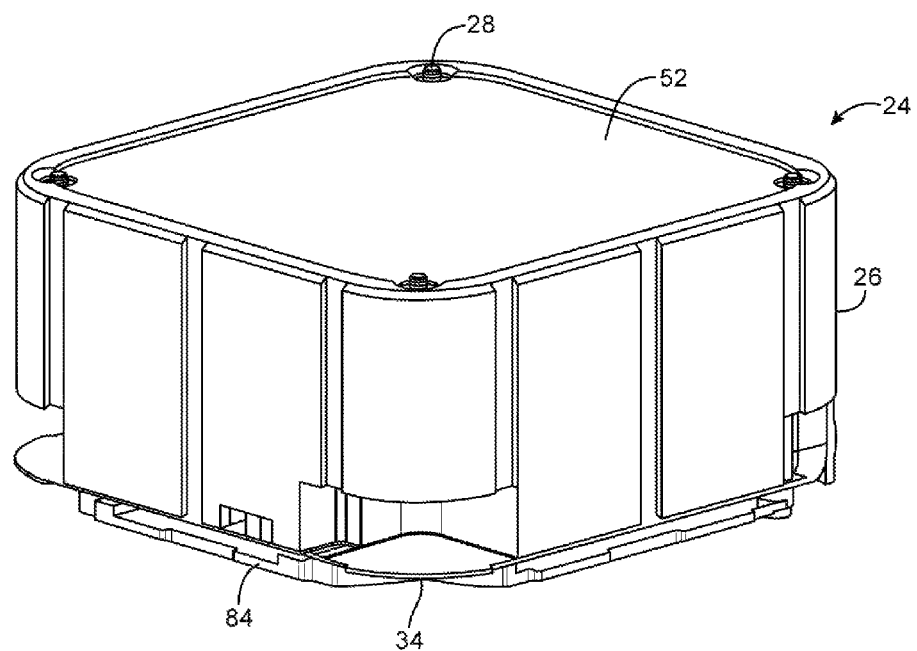
FIG. 10 is a perspective view of the electromagnetic interference shielding and thermal management structure of FIG. 9 with a shielding enclosure lid in accordance with an embodiment.

In the illustrative configuration of FIG. 10, lid 52 has been mounted to the top of enclosure 26 so as to enclose components for a power supply or other components 56 (FIG. 9) within the interior of enclosure 26.

Figure 11:
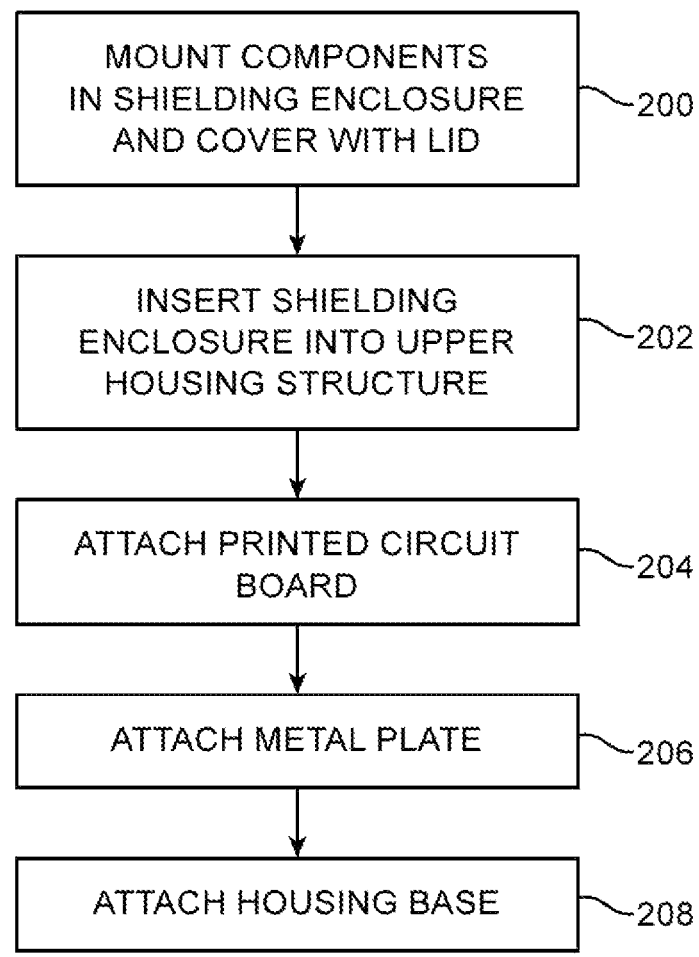
FIG. 11 is a flow chart of illustrative steps involved in assembling an electronic device that contains electromagnetic interference shielding and thermal management structures in accordance with an embodiment.

A flow chart of illustrative steps involved in assembling an electronic device that contains electromagnetic interference shielding and thermal management structures is shown in FIG. 11.

At step 200, power supply components or other components 56 on a dielectric substrate such as printed circuit board 58 may be mounted in interior cavity 32 of shielding enclosure 26. The components may form a power supply for device 56. After mounting components 56 within cavity 32, lid 52 may be used to cover the upper opening of shielding enclosure 26.

At step 202, shielding enclosure 26 may be installed within upper housing structure 12A using screws 28. An air gap may be formed between the exterior surfaces of shielding enclosure 26 and the opposing adjacent interior surfaces of housing structure 12A to prevent hotspots from developing on housing 12.

At step 204, printed circuit board 34 and the components mounted on the upper and lower surfaces of printed circuit board 34 may be placed against bottom wall 30 of shielding enclosure 26.

At step 206, metal plate 84 may be mounted to printed circuit board 34 and other internal structures 24. Screws 96 (FIG. 8) may be distributed in a pattern that helps prevent board 34 from flexing as board 34 and the components on board 34 are compressed between metal plate 84 and lower wall 30 of enclosure 26.

Assembly of electronic device 10 may be completed at step 208 by snapping housing structure 12B to housing structure 12A.

The foregoing is merely illustrative and various modifications can be made by those skilled in the art without departing from the scope and spirit of the described embodiments. The foregoing embodiments may be implemented individually or in any combination.

What is claimed is:

1. Apparatus, comprising:
   a first printed circuit;
   at least a first electrical component mounted on the first printed circuit;
   a metal electromagnetic interference shielding enclosure having a bottom wall and vertical sidewalls that form an interior cavity in which the first electrical component and the first printed circuit are mounted;
   a second printed circuit; and
   at least a second electrical component mounted on the second printed circuit, wherein the second electrical component is adjacent to the bottom wall so that heat from the second electrical component dissipates through the metal electromagnetic shielding enclosure.

2. The apparatus defined in claim 1 further comprising:
   at least a third electrical component mounted on the second printed circuit board, wherein the second and third electrical components are mounted on opposing sides of the second printed circuit board.

3. The apparatus defined in claim 2 further comprising a metal plate, wherein the metal plate is configured to dissipate heat from the third electrical component.

4. The apparatus defined in claim 3 further comprising:
   a first thermally conductive elastomeric pad between the second electrical component and the bottom wall; and
   a second thermally conductive elastomeric pad between the third electrical component and the metal plate.

5. The apparatus defined in claim 4 further comprising a plastic housing in which the metal electromagnetic interference shielding enclosure is mounted.

6. The apparatus defined in claim 5 wherein the plastic housing has first and second structures that are attached using engagement features and wherein the vertical sidewalls have grooves that are configured to accommodate at least some of the engagement features during assembly.

7. The apparatus defined in claim 1 further comprising a plastic insert in an opening in the bottom wall.

8. The apparatus defined in claim 7 further comprising metal rods that pass through the plastic insert.

9. The apparatus defined in claim 8 wherein the first printed circuit board has contacts coupled to the metal rods and wherein the second printed circuit board has contacts coupled to the metal rods.

10. The apparatus defined in claim 9 wherein the first electrical component comprises a power supply component and wherein the metal rods convey power from the first printed circuit board to the second printed circuit board.

11. The apparatus defined in claim 3 further comprising an antenna on a corner of the second printed circuit board.

12. The apparatus defined in claim 11 further comprising a corner recess in the metal plate that overlaps the antenna.

13. The apparatus defined in claim 3 further comprising a connector mounted to an edge of the second printed circuit board.

14. The apparatus defined in claim 13 wherein the metal plate has protrusions that define a recess that receives the connector.

15. The apparatus defined in claim 1 further comprising a conductive fence that is mounted to the second printed circuit board and that surrounds the second electrical component.

16. The apparatus defined in claim 3 further comprising a thermally conductive elastomeric pad between the second printed circuit board and the metal plate that conveys heat from the second electrical component through the metal plate.

17. The apparatus defined in claim 16 wherein the metal plate has a plurality of different thicknesses to accommodate electrical components of different sizes that are mounted on the second printed circuit board.

18. An electronic device, comprising:
a plastic housing;
internal structures mounted in the plastic housing, wherein the internal structures include a power supply enclosed within a metal shielding enclosure having a bottom wall, vertical sidewalls, and a lid;
a printed circuit board on which an integrated circuit is mounted; and
thermally conductive structures between the integrated circuit and the bottom wall that convey heat from the integrated circuit to the metal shielding enclosure.

19. The electronic device defined in claim 18 wherein the printed circuit board has an upper surface on which the integrated circuit is mounted and an opposing lower surface and wherein the internal structures comprise a metal plate adjacent to the lower surface.

20. The electronic device defined in claim 19 further comprising a thermally conductive elastomeric structure between the printed circuit board and the metal plate through which heat from the integrated circuit is conveyed to the metal plate.

21. Apparatus, comprising:
a metal electromagnetic signal shielding enclosure having a bottom wall, vertical sidewalls that extend upwards from the bottom wall, and a lid that encloses an interior cavity;
power supply circuitry in the interior cavity;
an integrated circuit;
a metal plate that dissipates heat from the integrated circuit; and
a printed circuit board on which the integrated circuit is mounted, wherein the printed circuit board has an upper surface that faces the bottom wall and has an opposing lower surface that faces the metal plate.

22. The apparatus defined in claim 21 wherein the integrated circuit is mounted on the upper surface and wherein the bottom wall dissipates heat from the integrated circuit.

23. The apparatus defined in claim 21 wherein the integrated circuit is mounted on the lower surface and wherein the apparatus further comprises a thermally conductive elastomeric structure that conveys heat from the integrated circuit to the metal plate.

\* \* \* \* \*